United States Patent
Camiade et al.

(10) Patent No.: US 7,388,450 B2
(45) Date of Patent: Jun. 17, 2008

(54) PACKAGED ELECTRONIC COMPONENTS FOR PRODUCING A SUB-HARMONIC FREQUENCY SIGNAL AT MILLIMETRIC FREQUENCIES

(75) Inventors: Marc Camiade, Bure-sur-Yvette (FR); Denis Domnesque, Orsay (FR); Klaus Beilenhoff, Gif-sur-Yvette (FR)

(73) Assignee: United Monolithic Semiconductor S.A.S. (FR)

( * ) Notice: Subject to any disclaimer, the term of this patent is extended or adjusted under 35 U.S.C. 154(b) by 0 days.

(21) Appl. No.: 10/534,251

(22) PCT Filed: Nov. 18, 2003

(86) PCT No.: PCT/EP03/50846

§ 371 (c)(1),
(2), (4) Date: May 10, 2005

(87) PCT Pub. No.: WO2004/049496

PCT Pub. Date: Jun. 10, 2004

(65) Prior Publication Data

US 2006/0097818 A1    May 11, 2006

(30) Foreign Application Priority Data

Nov. 22, 2002  (FR) .................................. 02 14684

(51) Int. Cl.
    *H01P 5/107*    (2006.01)
(52) U.S. Cl. .......................................... 333/26; 333/218
(58) Field of Classification Search ................. 333/26, 333/218

See application file for complete search history.

(56) References Cited

U.S. PATENT DOCUMENTS

| | | | | |
|---|---|---|---|---|
| 5,982,250 A | * | 11/1999 | Hung et al. | 333/26 |
| 6,040,739 A | * | 3/2000 | Wedeen et al. | 330/66 |
| 6,356,173 B1 | * | 3/2002 | Nagata et al. | 333/247 |
| 6,384,691 B1 | * | 5/2002 | Sokolov | 331/76 |

FOREIGN PATENT DOCUMENTS

EP    0920071    6/1999

OTHER PUBLICATIONS

Nagy, O., et al. "A Novel Uniplanar Transition Coplanar Waveguide to Rectangular Waveguide.", 31st European Microwave Conference Proceedings, London, Sep. 25-27, 2001, Proceedings of the European Microwave Conference, London: CMP, GB, vol. 2 of 3 Conf. 31, Sep. 25, 2001, pp. 285-288, XP001044896, ISBN: 0-86213-148-0.
Gresham, I. et al. "A Compact Manufacturable 76-77-GHZ Radar Module For Commercial ACC Applications." IEEE Transactions on Microwave Theory and Techniques, IEEE Inc. New York, US, vol. 49, No. 1, Jan. 1, 2001, pp. 44-58, XP001020506, ISSN: 0018-9480.

* cited by examiner

*Primary Examiner*—Benny Lee
(74) *Attorney, Agent, or Firm*—Lowe Hauptman Ham & Berner, LLP

(57) ABSTRACT

The invention relates to millimetric packaged electronic components for applications at high frequencies greater than 45 GHz. According to the invention, to facilitate the design of a system including MMIC chips working at these frequencies, it is proposed to use packages containing one or more chips, these packages making it possible to work at these frequencies and including two types of port: a port with transition by contactless electromagnetic coupling providing a connection with an antenna at the high working frequency F via a waveguide; and a port with microstrip or coaxial line type transition enabling a connection at a subharmonic frequency F/N (preferably N=6 or 4 or, if necessary, 3) of the working frequency.

17 Claims, 1 Drawing Sheet

PACKAGED ELECTRONIC COMPONENTS FOR PRODUCING A SUB-HARMONIC FREQUENCY SIGNAL AT MILLIMETRIC FREQUENCIES

CROSS-REFERENCE TO RELATED APPLICATIONS

The present Application is based on International Application No. PCT/EP2003/050846, filed on Nov. 18, 2003, which in turn corresponds to FR 02/14684 filed on Nov. 22, 2002, and priority is hereby claimed under 35 USC § 119 based on these applications. Each of these applications are hereby incorporated by reference in their entirety into the present application.

FIELD OF THE INVENTION

The invention relates to electronic circuits working at very high frequencies, greater than 45 GHz, also called "millimetric frequencies".

BACKGROUND OF THE INVENTION

These electronic circuits are used for radar type applications in which an electromagnetic wave is sent at a millimetric frequency and a wave reflected by an obstacle is received by an antenna, to extract from this wave, on the one hand, distance information and, on the other hand, relative speed information, between this obstacle and the source that sent the wave.

The millimetric frequency circuits can also be used for short distance and very high bit rate communication applications.

Whatever the application, the electronic processing of the millimetric frequency signals comprises a low frequency processing part that can be implemented by silicon integrated circuits mounted on printed circuits. This part can be produced by very commonly used and inexpensive technologies, with connections that are simple to produce between circuit elements on one and the same integrated circuit chip or between different integrated circuit chips. The processing also comprises a very high frequency part (greater than 45 GHz), that can be implemented only by components and integrated circuits made of semiconductor materials other than silicon (gallium arsenide GaAs and its derivatives in particular, or even SiGe). These integrated circuits are called "microwave monolithic integrated circuits" or MMIC. This high-frequency part raises problems of production that are difficult and usually prove very expensive.

In practice, for relatively complex functions, it is necessary to use a large number of MMIC integrated circuit chips, since the quantity of circuit elements that can be placed in one and the same chip is far more limited for the MMIC circuits than for the low frequency circuits made of silicon. Also, these chips are mounted on a substrate with interconnections that are difficult to produce given the very high working frequencies. The design of the interconnections is difficult, and the production cost is high because of the precision required in maintaining tight tolerances to ensure the transmission of the millimetric frequency signals. This becomes all the more true as the number of MMIC chips increases in the system. Also, the increase in complexity of the functions that are to be produced brings with it an increase in the number of chips.

Mounting the chips on a hybrid substrate (normally mounting with wiring to link the chips to the hybrid substrate) is itself very expensive when the number of chips is high.

SUMMARY OF THE INVENTION

The object of the present invention is to reduce the cost of the electronic systems operating at millimetric frequencies greater than 45 GHz (and preferably greater than 60 GHz) and including MMIC chips.

To achieve this cost reduction, the invention proposes to use a new type of component to produce the system. This electronic component is a component mounted in an individual package and intended to be connected to other components of an electronic system, for example on a printed circuit board with a number of components; this component comprises at least one integrated circuit chip MMIC working around a main millimetric frequency F greater than 45 GHz. The package has at least two ports for communicating electrical signals between the interior and the exterior of the package, the first port being a port with transition by electromagnetic coupling (i.e. without physical electrical contact) for the transmission of the main working frequency greater than 45 GHz, and the second port being a port with microstrip or coaxial type transition for the transmission of a working frequency F/N that is a subharmonic of the main frequency F.

The subharmonic frequency is preferably one of the following four frequencies: F/6 or F/4 or F/3 (or, in extreme cases, it could be F/2).

For a working frequency at 77 GHz, the subharmonic frequency is therefore 1/6 or 1/4 or 1/3 of 77 GHz.

The package is preferably provided with a conductive cover positioned at a distance from the first port that create, near this port, an electromagnetic short circuit at the main working frequency, this short circuit forming a wave reflector facilitating the contactless transmission of this frequency through the first port.

The height of the conductive cover above the first port is preferably equal to a quarter of the wavelength of the main working frequency, to provide this short circuit and reflector role. This height can also be an odd multiple of a quarter of the wavelength.

One or more of MMIC chips present in the package will preferably comprise means of multiplying in a ratio N to change from the subharmonic frequency to the main working frequency. It could also, in certain cases, include means of dividing frequencies in the ratio N.

The component therefore has the specific feature that it includes a port with no physical contact, dedicated to the passage of signals at the main frequency, and a port with contact dedicated to the passage of signals at the subharmonic frequency.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

BRIEF DESCRIPTION OF THE DRAWINGS

Other features and advantages of the invention will become apparent from reading the detailed description that follows and which is given with reference to the appended drawings in which.

DETAILED DESCRIPTION OF THE INVENTION

Figure 1:
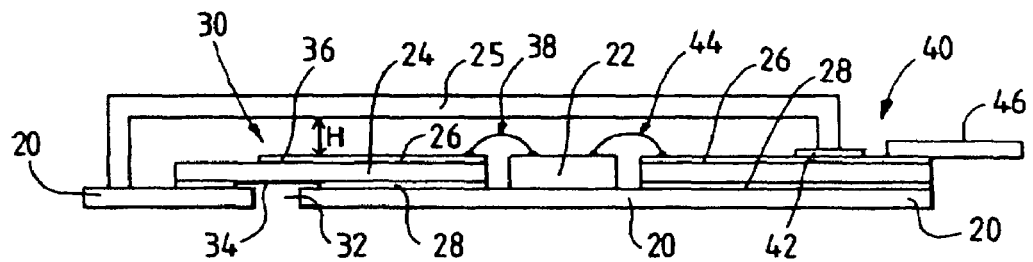
FIG. 1 represents a millimetric package component according to the invention.

A typical application in which the component according to the invention can be used is a radar application, in which, on the one hand, a millimetric frequency greater than 45 GHz, in this example, a frequency of 77 GHz, is to be sent by a first antenna and, on the other hand, the electromagnetic wave reflected by an obstacle is to be received by several different antennas. It therefore concerns a multiple-beam radar. The presence of several receive antennas makes it possible to observe the presence of obstacles in a wider angular field and also to locate the detected obstacle with greater accuracy.

According to the invention, it is proposed to place the MMIC chips individually in sealed packages, called millimetric packages, capable of working at frequencies greater than 45 GHz, and having external ports to allow for a link by contactless electromagnetic coupling at the working frequency, in this case 77 GHz, with transmit or receive antennas or with waveguides leading to these antennas.

The transmission by electromagnetic coupling at these very high frequencies is provided by the use of the free propagation properties of the electromagnetic signals inside the package and, above all, between the inside and the outside. This package comprises in particular a conductive cover (metallic or metallized cover) which encloses the propagation lines of the signals from the chip or to the chip. The conductive cover is located above the contactless external port, at a distance such that it forms (at the main working frequency for which the component is designed) an electromagnetic short circuit facilitating signal transmission in free propagation mode via this port.

The ports at the working frequency F of more than 45 GHz are transitions by electromagnetic coupling in air (or in a gas or in a vacuum) and in particular conductive elements capable of radiating towards a waveguide placed in line with these elements, or capable of receiving an electromagnetic radiation at the output of a waveguide that they are placed in front of. The package enclosing the MMIC chips includes a non-conductive part in line with these conductive elements so as to allow the electromagnetic energy to pass between the waveguide and the conductive elements.

The package preferably has, in addition to one or more external contactless ports capable of effective coupling at greater than 45 GHz, ports not capable of working effectively at a frequency greater than 45 GHz but designed to work at a subharmonic frequency of the working frequency. Also, the chips contained in these components then preferably include the necessary frequency multiplication means to change from the subharmonic frequency to the main frequency.

The ports not capable of working at 77 GHz but capable of working above 10 GHz, even up to 25 GHz or a little above, are produced using microstrip lines or coaxial lines. The connection of the component with other components placed on the same substrate will be made easily because the frequencies carried are far lower than the millimetric working frequency.

FIG. 1 is a cross-sectional representation of a component according to the invention. This example shows only one MMIC chip in the package of the component, but there can be two, or even, in exceptional cases, three.

Figure 2:
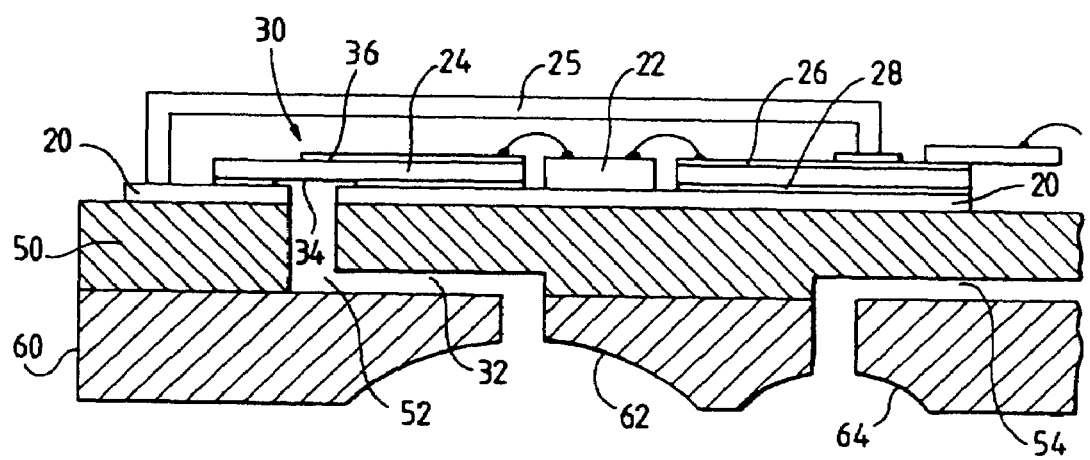
FIG. 2 represents a component according to the invention associated with a radar antenna.

The package is conductive, for example metallic or partially metallic; it preferably includes a metallic base 20, serving as a substrate on which is directly mounted the rear face of the MMIC chip 22, a double-sided ceramic substrate 24 providing the interconnections inside the package and towards the outside of the package, and a metallic or metallized cover 25 covering the base, to enclose, between the base and the cover, the chip or chips and the ceramic substrate. Since the MMIC chip 22 is welded directly onto the base, the ceramic substrate 24 includes an opening in which the chip is inserted. The ceramic substrate 24 is preferably a substrate metallized on both sides: as shown in FIGS. 1 and 2, metallization 26 on the front side forms the transmission lines, and metallization 28 on the rear side forms a ground plane. The dimensions of the various dielectric and conductive parts are such that the component operates correctly at the working frequency concerned (77 GHz). The metallizations 26 and 28 are used, to create the interconnections between chips and, to create the external ports of the package, both the ports capable of working at 77 GHz and the ports designed to transmit a frequency that is a subharmonic at 77 GHz.

In the example of FIG. 1, the port 30 capable of transmitting the 77 GHz frequency comprises a transition by contactless electromagnetic coupling enabling the signal at the frequency of 77 GHz to pass without contact from a waveguide to the chip or vice versa.

This transition by electromagnetic coupling is preferably via an opening 32 in the package, and more specifically in the metallic base 20. This opening 32 communicates with a waveguide not shown in FIG. 1. This opening is physically, but not electromagnetically, closed by the ceramic substrate 24. It is in line with a demetallized area 34 provided in the metallization 28 of the rear side of the ceramic substrate. On the front metallization 26, forming a microstrip line from the MMIC chip 22 to the port 30, the end 36 of the microstrip line terminates exactly in line with the center of the opening 32 of the base 20. This end 36, together with the demetallized area 34 which is surrounded by the metallization 28 forming a ground plane, forms a radiating element, therefore an antenna, communicating, for example, with a waveguide placed in front of the opening 32, directly coupling the waveguide with the microstrip line by electromagnetic means. Above the end 36 of the microstrip line, the conductive surface of the cover is located at a distance suited to the wavelength of the main working frequency of the signals transmitted by this line, this distance being such that the cover forms an electromagnetic short circuit and therefore a reflector for the antenna radiated by the end 36 of the microstrip line. For example, the height H of the cover above the metallization of the ceramic substrate 24, is equal to a quarter of the wavelength corresponding to this frequency or very close to this value. It can also be an odd multiple of a quarter of the wavelength.

At the other end of the microstrip line, a wired link 38 is provided between the chip and the line. The resulting coupling operates at 77 GHz provided that the dimensions of the metallized and non-metallized areas, the thickness of the ceramic substrate and the width of the opening in the ceramic substrate are chosen correctly, suited to the wavelength corresponding to the main frequency of 77 GHz.

In the main application envisaged, the waveguide is connected to an antenna receiving (or transmitting) the reflected radar wave, and the end 36 of the microstrip line acts as an element for receiving an electromagnetic wave entering into the package.

The other port shown in FIG. 1 is a direct port 40 by microstrip line, not allowing a communication at 77 GHz but allowing a communication at a subharmonic frequency which is preferably F/6 but which can also be F/4 or F/3, or even F/2 in certain cases. The microstrip line corresponding to this port is formed in the top metallization 26 of the metallized ceramic substrate 24. The bottom metallization 28 serves as a ground plane. The line passes from the inside to the outside of the package via a local interruption of the conductive cover 25, by insulating the microstrip line from the cover, for example by an insulating washer 42 interposed between the line and the edge of the cover, or via a notch in the cover.

On the side of this subharmonic frequency port 40, the MMIC chip is also linked to the microstrip line by a wired link 44.

The component can be connected externally by the port 40 with another similar component mounted on the same hybrid substrate, or with a different component mounted on the same hybrid substrate or mounted on a conventional printed circuit. This connection can be made directly from the top metallization surface 26 which extends outside the package; for example, a wire can be soldered to this top surface; or it can even be via a lead 46 soldered to this external part of the metallization 26 and then forming an integral part of the component.

It will therefore be understood that in an electronic system using this component, a common substrate will have mounted on it not individual chips but components of the type that has just been described, so significantly simplifying the design and fabrication of the system.

FIG. 2 represents the use of the component of FIG. 1 in a radar electronic system. In it can be recognized the assembly (base 20, chip 22, cover 25) of the component of FIG. 1. The base 20 is mounted directly in contact with a metallic plate 50 which is a waveguide plate: in this plate, a waveguide 52 is formed, the output end of which is just in line with the opening 32 of the base 20, therefore in line with the conductive end 36 which provides an electromagnetic coupling between the waveguide and the package.

The other end of the waveguide, the input end in this application, is in line with the transmission center of a parabolic radar receive antenna 62 machined in a metallic plate 60 placed against the waveguide plate 50. The waveguide plate 50 can include a number of waveguides, for example a second guide 54 leading to a second antenna 64 machined in the same antenna plate 60; this guide directs the electromagnetic wave received from the second antenna to a second millimetric packaged component, not shown, similar to the component of FIG. 1 and mounted like the latter on the plate 50 forming a substrate common to a number of components according to the invention.

In the embodiments of FIGS. 1 and 2, it was assumed that the ceramic substrate 24 was fixed on a metallic base. It is possible to envisage no metallic base, the package being formed by the ceramic substrate, metallized on both sides, and the metallic cover. In this case, the port 30 with transition by electromagnetic coupling is produced in exactly the same way; the demetallized area 34 provided in the rear metallization 28 takes the place of the opening 32 which does not exist since the base does not exist. The waveguide is exactly in line with this demetallization.

In a different embodiment, it is possible to provide for the microstrip line, a free end of which is used as a contactless electromagnetic transition, to be carried by an MMIC chip (the same as or other than the chip 22) instead of being carried by a ceramic substrate as is the case in FIGS. 1 and 2. In this case, the MMIC chip thus used as an electromagnetic transition is fixed on a metallic base of the package, a part of the chip extending in line with an opening provided in the base, opening which is itself in line with a waveguide. The free end of the microstrip line carried by the MMIC chip is then in line with the opening in the base to form a contactless electromagnetic transition through this opening.

The description above proposes a transition by electromagnetic coupling which uses the cover of the package as a reflector to produce the transition. However, it is possible also to envisage other types of transition by coupling, for example non-reflector transitions, using the geometry of the different elements of the package to facilitate the electromagnetic coupling. For example, a transition that uses an electromagnetic coupling between a microstrip line on the top side of the substrate 24 (or of the chip 22) and a slot line (demetallization 34 in the form of a slot) on the bottom side. A reflector is not then necessary and this embodiment would be suited in particular to cases in which the cover of the package was of plastic material.

Components according to the invention can be used to produce complete electronic systems on inexpensive printed circuit substrates (resin-based substrates) combining low-frequency components (integrated circuit chips or other components operating at low frequency), and components operating up to approximately 25 GHz. These components are linked to millimetric packaged components according to the invention by microstrip connections, and the millimetric packaged components are connected to antennas by transitions with contactless electromagnetic coupling and by waveguides.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. An electronic component mounted in an individual package and intended to be connected to other components of an electronic system, said electronic component comprising:
one or more integrated circuit chips working around a main millimetric frequency F greater than 45 GHz, wherein said package has at least two ports for communicating electrical signals between the interior and the exterior of said package, the first port being a port with transition by contactless electromagnetic coupling for the transmission of signals at the main frequency greater than 45 GHz, and the second port being a port with microstrip or coaxial type transition for the transmission of a main frequency F/N that is a subharmonic of the frequency F, where N is $\geq 2$.

2. The component as claimed in claim 1, wherein the package is provided with a conductive cover positioned at a distance from the first port such that said conductive cover sets up, above this port, an electromagnetic short circuit at the main frequency, thus forming a wave reflector facilitating the transmission of said main frequency through the first port.

3. The component as claimed in claim 2, wherein the conductive cover is at a height above the port equal to a quarter of the wavelength, or an odd multiple of the quarter of the wavelength of the main frequency.

4. The component as claimed in claim 3, wherein one of the chips included in said package comprises means for multiplying frequency by a ratio N to change from the subharmonic frequency to the main frequency.

5. The component as claimed in claim 3, comprising a ceramic substrate, a first metallized side of which is etched to form a microstrip line having a free end and another side of which is also metallized to form a ground plane, the ground plane being interrupted facing the free end, to provide contactless electromagnetic coupling between the interior and the exterior of the package via the microstrip free end.

6. The component as claimed in claim 3 wherein said one or more chips including one or more MMIC chips fixed on a base, said one of the chips MMIC including a microstrip line, having one free end in which used as the contactless electromagnetic transition, said one MMIC chip extending over an opening in the base so that the free end of the line is located in line with the opening, in order to form a contactless electromagnetic transition through the opening.

7. The component as claimed in claim 2, comprising a ceramic substrate, a first metallized side of which is etched to form a microstrip line having a free end and another side of which is also metallized to form a ground plane, the ground plane being interrupted facing the free end, to provide contactless electromagnetic coupling between the interior and the exterior of the package via the microstrip free end.

8. The component as claimed in claim 2, wherein said one or more chips including one or more MMIC chips fixed on a base, one of the chips MMIC including a microstrip line, having one free end which is used as the contactless electromagnetic transition, said one MMIC chip extending over an opening in the base so that the free end of the line is located in line with the opening, in order to form the contactless electromagnetic transition through the opening.

9. The component as claimed in claim 2, wherein one of the chips included in said package comprises means for multiplying frequency by a ratio N to change from the subharmonic frequency to the main frequency.

10. The component as claimed in claim 1, wherein said one or more chips comprising one or more MMIC chips fixed on a base, one of the chips MMIC including a microstrip line, having one free end which is used as the contactless electromagnetic transition, said one MMIC chip extending over an opening in the base so that the free end of the line is located in line with the opening, in order to form the contactless electromagnetic transition through the opening.

11. The component as claimed in claim 1, wherein one of the chips included in said package comprises means for multiplying frequency by a ratio N to change from the subharmonic frequency to the main frequency.

12. The component as claimed in claim 11, wherein said one or more chips including one or more MMIC chips fixed on a base, said one of the chips MMIC including a microstrip line, having one free end which is used as the contactless electromagnetic transition, said one MMIC chip extending over an opening in the base so that the free end of the line is located in line with the opening, in order to form the contactless electromagnetic transition through the opening.

13. The component as claimed in claim 11, comprising a ceramic substrate, a first metallized side of which is etched to form a microstrip line having a free end and another side of which is also metallized to form a ground plane, the ground plane being interrupted facing the free end, to provide contactless electromagnetic coupling between the interior and the exterior of the package via the microstrip free end.

14. The component as claimed in claim 1, comprising a ceramic substrate, a first metallized side of which is etched to form a microstrip line having a free end and another side of the ceramic subtrate is also metallized to form a ground plane, the ground plane being interrupted facing the free end, to provide the contactless electromagnetic coupling between the interior and the exterior of the package via the microstrip free end.

15. The component as claimed in claim 14, wherein a conductive cover is at a height above the free end of the microstrip line equal to a quarter of the wavelength, or an odd multiple of a quarter of the wavelength of the main frequency.

16. The component as claimed in claim 15, including a metallic base open facing the microstrip free end.

17. The component as claimed in claim 14, comprising a metallic base open facing the microstrip free end.

* * * * *